US010048334B2

(12) United States Patent
Paul

(10) Patent No.: US 10,048,334 B2
(45) Date of Patent: Aug. 14, 2018

(54) TEST OF A REORDERING ALGORITHM OF A SPIN ECHO MAGNETIC RESONANCE PULSE SEQUENCE

(71) Applicant: Siemens Healthcare GmbH, Erlangen (DE)

(72) Inventor: Dominik Paul, Bubenreuth (DE)

(73) Assignee: Siemens Healthcare GmbH, Erlangen (DE)

( * ) Notice: Subject to any disclaimer, the term of this patent is extended or adjusted under 35 U.S.C. 154(b) by 998 days.

(21) Appl. No.: 13/916,967

(22) Filed: Jun. 13, 2013

(65) Prior Publication Data

US 2013/0335077 A1   Dec. 19, 2013

(30) Foreign Application Priority Data

Jun. 14, 2012 (DE) ........................ 10 2012 209 955

(51) Int. Cl.
*G01R 33/38* (2006.01)
*G01R 33/565* (2006.01)
*G01R 33/48* (2006.01)
*G01R 33/561* (2006.01)

(52) U.S. Cl.
CPC ....... *G01R 33/38* (2013.01); *G01R 33/56554* (2013.01); *G01R 33/4822* (2013.01); *G01R 33/5617* (2013.01)

(58) Field of Classification Search
USPC ........................... 324/300–322; 600/407–435
See application file for complete search history.

(56) References Cited

U.S. PATENT DOCUMENTS

| 5,652,516 | A  | * | 7/1997 | Adalsteinsson | ...... G01R 33/485 324/307 |
| 5,779,636 | A  | * | 7/1998 | Kanazawa | ......... G01R 33/4822 324/309 |
| 5,912,557 | A  | * | 6/1999 | Wilman | ............. G01R 33/4822 324/307 |
| 6,020,739 | A  | * | 2/2000 | Meyer | ................ G01R 33/4824 324/300 |
| 6,239,598 | B1 | * | 5/2001 | Zhang | .................... G01R 33/58 324/307 |
| 6,239,599 | B1 | * | 5/2001 | Zhou | ...................... G01R 33/58 324/307 |

(Continued)

FOREIGN PATENT DOCUMENTS

DE   102005040548 A1   3/2007

OTHER PUBLICATIONS

R.F. Busse et al: "Flexible and Efficient View Ordering for 3D Sequences with Periodic Signal Modulation", Proc. Intl. Soc. Mag. Reson. Med. 16 (2008); p. 837; 2008.

*Primary Examiner* — Melissa Koval
*Assistant Examiner* — Tiffany Fetzner
(74) *Attorney, Agent, or Firm* — Schiff Hardin LLP

(57) ABSTRACT

A test method for a reordering algorithm of a 3D spin echo magnetic resonance pulse sequence is provided, in which echo train positions are checked for at least two k-space elements. Further, a non-transitory computer readable medium and a magnetic resonance tomography system which comprises a test device for testing a reordering algorithm of a 3D spin echo magnetic resonance pulse sequence featuring a checking module for checking the echo train position for at least two k-space elements are provided.

10 Claims, 2 Drawing Sheets

(56) References Cited

U.S. PATENT DOCUMENTS

| | | | |
|---|---|---|---|
| 6,323,646 B1* | 11/2001 | Zhou | G01R 33/56341 324/309 |
| 6,483,306 B2* | 11/2002 | Hahn | G01R 33/54 324/307 |
| 6,700,374 B1* | 3/2004 | Wu | G01R 33/56554 324/306 |
| 6,801,037 B1* | 10/2004 | Zhang | G01R 33/54 324/309 |
| 6,933,720 B2* | 8/2005 | Zhang | G01R 33/56554 324/307 |
| 6,937,015 B2* | 8/2005 | Heid | G01R 33/54 324/307 |
| 7,078,899 B2* | 7/2006 | Dale | G01R 33/54 324/307 |
| 7,359,745 B2* | 4/2008 | Lewin | G01R 33/022 324/312 |
| 7,728,588 B2* | 6/2010 | Feiweier | G01R 33/4818 324/306 |
| 7,888,935 B1* | 2/2011 | Tan | G01R 33/56518 324/307 |
| 7,949,384 B2* | 5/2011 | Lewin | G01R 33/022 324/306 |
| 8,060,180 B2* | 11/2011 | Pai | G01R 33/563 324/307 |
| 8,154,294 B2* | 4/2012 | Takizawa | G01R 33/482 324/309 |
| 8,676,296 B2* | 3/2014 | Park | A61B 5/055 600/410 |
| 9,465,094 B2* | 10/2016 | Feiweier | G01R 33/50 |
| 2003/0109781 A1* | 6/2003 | Zhang | G01R 33/56554 600/410 |
| 2004/0041563 A1* | 3/2004 | Lewin | G01R 33/022 324/307 |
| 2005/0057249 A1* | 3/2005 | Dale | G01R 33/54 324/307 |
| 2006/0161060 A1* | 7/2006 | Pai | G01R 33/563 600/431 |
| 2008/0061779 A1* | 3/2008 | Feiweier | G01R 33/4818 324/307 |
| 2008/0154119 A1* | 6/2008 | Lewin | G01R 33/022 600/410 |
| 2010/0164495 A1* | 7/2010 | Takizawa | G01R 33/482 324/309 |
| 2011/0213237 A1* | 9/2011 | Park | A61B 5/055 600/410 |
| 2011/0260726 A1* | 10/2011 | Techavipoo | G01R 33/246 324/309 |
| 2013/0335077 A1* | 12/2013 | Paul | G01R 33/38 324/307 |

* cited by examiner

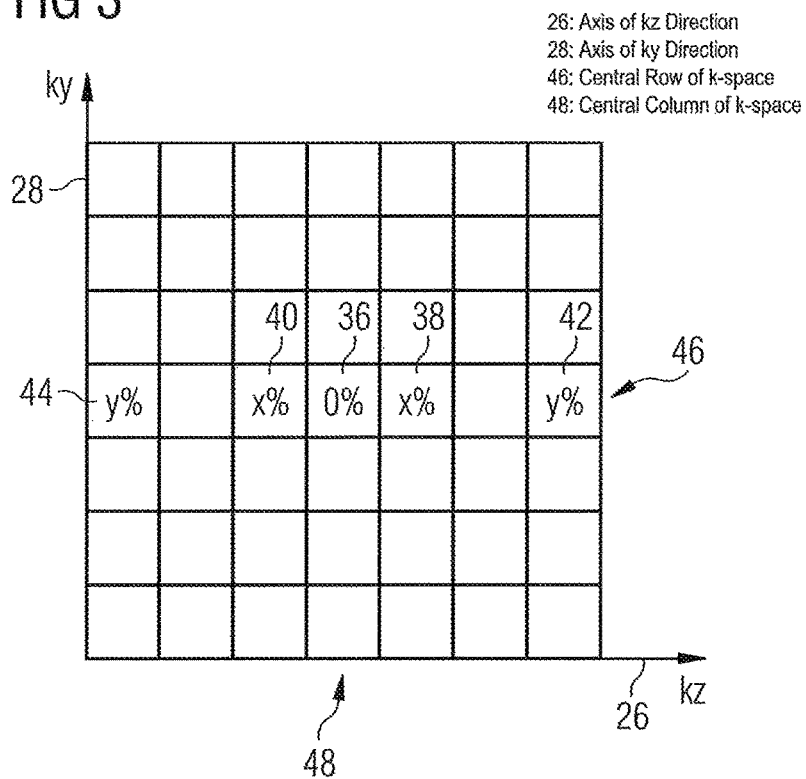
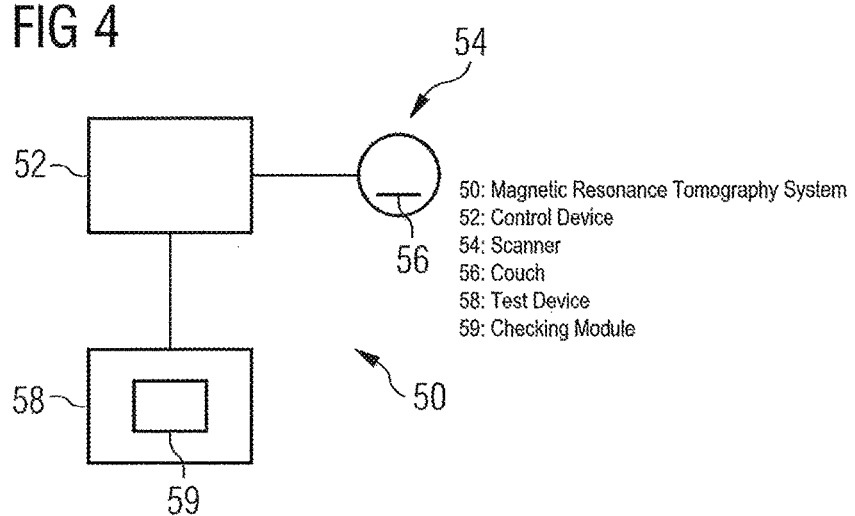

TEST OF A REORDERING ALGORITHM OF A SPIN ECHO MAGNETIC RESONANCE PULSE SEQUENCE

CROSS REFERENCE TO RELATED APPLICATIONS

The present application claims priority to European Patent Office application No. 10 2012 209 955.7 DE filed Jun. 14, 2012, the entire content of which is hereby incorporated herein by reference.

FIELD OF INVENTION

The invention relates to a test method for a reordering algorithm of a spin echo magnetic resonance pulse sequence. The invention further relates to a test device and to a magnetic resonance tomography system comprising a test device for testing a reordering algorithm.

SUMMARY OF INVENTION

Atomic nuclei, for example of hydrogen atoms, exhibit spin. The spin is a quantum mechanical property of atomic particles. The spin causes the atomic particles to be magnetic, i.e. an atomic nucleus having spin is always magnetic. These spins initially occur in any direction. They can be considered as a vector. Atoms having spin are present in a body to be examined, e.g. a human body. The body to be examined is usually exposed to a relatively strong basic magnetic field $B_0$, e.g. 3 or 7 Tesla, by means of a basic field magnetic system in a magnetic resonance tomography system. The dynamic effect of the static magnetic field $B_0$ produces a preferred direction of the spins parallel and anti-parallel to the lines of magnetic flux. In this case, an excess always develops in one direction, resulting in a macroscopic magnetization of the spin ensemble.

In magnetic resonance tomography, the static magnetic field $B_0$ is superimposed by a high-frequency magnetic field $B_1$. This high-frequency magnetic field dislodges the spins from the equilibrium that is produced by the $B_0$ field. Using high-frequency excitation signals, the nuclear spins of specific atoms which are resonantly excited by this high-frequency field are locally tilted by a defined flip angle relative to the lines of magnetic flux of the basic magnetic field.

A magnetic resonance pulse sequence is a series of high-frequency pulses for generating a high-frequency magnetic field $B_1$, which locally deflect specific atoms by a defined flip angle in a defined manner. In the case of 2D magnetic resonance pulse sequences, a layer of atoms is excited in each case. In the case of a 3D magnetic resonance pulse sequence, not just a layer but a whole volume (so-called "slab") is excited concurrently. The invention is described below with reference to a 3D magnetic resonance pulse sequence, since its application is particularly advantageous in this context. It should nonetheless be understood that the invention can also be used for 2D magnetic resonance pulse sequences.

Following the excitation, the nuclear spins tilt back to their initial position as dictated by the basic magnetic field. This is the so-called relaxation of the nuclear spins. A distinction is made between longitudinal relaxation and transverse relaxation. The longitudinal relaxation describes the reestablishment of the magnetization along the lines of magnetic flux of the basic magnetic field $B_0$. The transverse relaxation describes the disappearance of the magnetization produced by the high-frequency field $B_1$ transverse to the lines of magnetic flux of the basic magnetic field $B_0$. Different tissues exhibit different relaxation times.

High-frequency signals (so-called magnetic resonance signals) are emitted during the relaxation, being then received by means of suitable receive antennas and subsequently processed. The desired image data can be reconstructed from the raw data acquired thus.

The raw data is entered into a matrix, the so-called k-space. The k-space corresponds to a space (or also a space frequency location) which is Fourier-conjugated to a location space that contains the object magnetization. The axes of the k-space designate so-called location frequencies. The k-space has a unit which is inverse to the distance, e.g. 1/cm.

Static magnetic field differences contribute to a diversification of the spins during the relaxation. Spin echo sequences are used to reverse this diversification by means of a refocusing pulse or a series of refocusing pulses. In the event of a plurality of successive refocusing pulses, usually 180° pulses, a plurality of spin echoes are produced as a result of a multi-echo sequence. The earlier echoes, i.e. the echoes having a smaller position number, are typically entered into the central k-space first.

One example of a turbo spin echo sequence method, more precisely a single slab 3D turbo spin echo method, which can feature echo trains of up to 1000 echoes, is SPACE (Sampling Perfection with Application optimized Contrast using different flip angle Evolutions). The "prescribed signal evolution" has a profile as illustrated in FIG. 1 in this case. The flip angle of the refocusing pulses in an echo train is adapted to the properties (T1 and T2) of the different tissue types here, and therefore a variable flip angle evolution is obtained. The curves as illustrated in FIG. 1 are designed to produce a desired signal strength for different types of tissue. This makes it possible to produce a desired contrast, for example.

For the purpose of reading or acquiring the raw data, phase coding takes place in two reciprocally perpendicular directions, generally designated as ky direction and kz direction. In the case of SPACE, frequency coding takes place in the third direction of a Cartesian system of coordinates, i.e. a direction which is perpendicular to the two first directions, e.g. a kx direction.

Phase coding means that a linear spatial variation of the phase angle is achieved as a result of applying a gradient pulse during transverse or perpendicular magnetization. More precisely, the precession of the spins has a different phase relationship depending on location in each case. The phase coding is repeated N times with N different values for the gradient pulse, thus producing N different sets of k-values $ky_1, ky_2, \ldots ky_N$. $\Delta ky$ is the phase coding increment. The phase coding gradient pulse is emitted at some time between the emission of the RF pulse and the readout. In the case of echo pulse trains, it can be emitted before or after the refocusing pulse. The phase coding allows a spatial assignment of the echo. The order of the phase coding steps has an influence on the image quality. Large signal jumps can result in blurring.

In the case of a magnetic resonance method featuring two phase-coding directions, as in the case of SPACE, the two phase-coding gradients can be increased independently of each other. In a so-called nested iteration or nested loop, for each value or step of the phase coding in one direction, all of the steps of the phase coding are performed in the other direction. This results in a row-by-row generation of the k-space in the ky-kz plane.

Using the raw data captured thus, SPACE provides for a three-dimensional k-space to be filled by means of an additional frequency gradient in a kx direction. A 3D Fourier transformation can be used to reconstruct an image from the raw data of the 3D k-space. In flexible reordering methods, the k-space is not necessarily filled row-by-row, but along various trajectories. If measured data from different echo trains is used, measured data from different echo trains can be entered adjacently in the k-space. According to one approach, for example, when filling the k-space with measured data from different echo trains, the prescribed signal evolution is used to provide echo trains having different properties, i.e. having e.g. a defined contrast between two specific tissue types.

While this so-called flexible reordering has greatly simplified the use of SPACE sequences, and iPAT2 and elliptical scanning have also become possible, new artifacts can also occur as a result of this. iPAT2 signifies parallel imaging in which only every $x^{th}$ line is measured, e.g. every second line (in a ky direction and a kz direction). In elliptical scanning, part of the k-space (generally the corners in the ky-kz plane) is not included, and is filled with zeros during the reconstruction (zero filling) in order to save time. Artifacts can occur if adjacent k-space positions are not filled by adjacent echoes in the echo sequence. By virtue of said flexible reordering, the number of echo trains used for image generation becomes independent of the number of phase coding steps. The number of echo trains can be greater than or smaller than the number of phase coding steps in a ky direction or a kz direction.

The interval between two pulse echoes is ΔS. Jumps ΔS which are too large can result in artifacts. This occurrence of artifacts is considered in greater detail below with reference to FIG. 1.

In FIG. 1, the normalized signal intensities in arbitrary units are plotted over the individual echoes of an echo pulse sequence in a diagram. The numbers on the horizontal axis (20, 40, 60, . . . ) designate the position in the echo sequence. In the center of the k-space, a signal having higher intensity is represented more brightly in the subsequent image than signals having lower signal intensity. This means that the tissue according to curve 24 appears darker in the image than the tissue according to curve 14.

An interval ΔS designates the interval between the $40^{th}$ pulse and the $53^{rd}$ pulse by way of example. Curves 14, 16, 18, 20, 22 and 24 show the signal profiles or signal evolutions for different tissue types. The curve 14 represents a tissue which has a T1/T2 ratio of 1,500/200 in this case. The time constant T1 represents the relaxation time of the longitudinal magnetization, and T2 is the time constant for the relaxation of the transverse magnetization in this case.

The curve 16 designates a tissue having a T1/T2 ratio of 750/200. The curve 18 represents a tissue having a T1/T2 ratio of 940/100. The curve 20 represents a T1/T2 ratio of 1,200/75. The curve 22 represents a T1/T2 ratio of 1,500/50. The curve 24 represents a T1/T2 ratio of 750/50. The values specified here are exemplary. The different relaxation times for different tissues are known to a person skilled in the art. The difference in the relaxation times is essential to the generation of a contrast in the image.

If the signals from the $40^{th}$ echo and the $53^{rd}$ echo are adjacent in the k-space and the examined tissue is the tissue according to curve 18, the signal difference is negligible. The $40^{th}$ echo and the $53^{rd}$ echo have almost the same signal intensity. However, if signals from the $40^{th}$ and the $53^{rd}$ pulse are adjacent in the k-space and the tissue has a signal profile according to curve 14, the signal difference is between 0.41 and 0.44 in the selected arbitrary units, and this can result in artifacts.

Novel algorithms which specify the k-space sampling are continuously being developed for particular imaging tasks. A large signal difference in the k-space can be mathematically described by a superimposed rectangular function. The subsequent Fourier transformation converts this rectangular function into a sine function which is superimposed on the image and results in blurring accordingly.

An object is to provide a method for testing reordering algorithms. This method prevents artifacts. This object is achieved by a method and a device as claimed in the claims.

According to the inventive method, the echo train position is checked for at least two k-space elements. If the echo train positions are grouped tightly together, the signal difference between these two k-space elements is guaranteed to be small. As a result of comparing echo train positions instead of signal intensities, the test method can be defined independently of the tissue. Consequently, the test method also remains independent of the imaging task.

The checking of the echo train position can be preceded by the simulation of an emission of the relevant 3D spin echo magnetic resonance pulse sequence. It is again noted that the k-space is a matrix, the phase coding steps in a kz direction being plotted along the rows and the phase coding steps in a ky direction being plotted down the columns The third dimension in the 3D method is the frequency coding direction (kx).

The inventive test device for testing a reordering algorithm of a spin echo magnetic resonance pulse sequence comprises a checking module for checking the echo train position for at least two k-space elements.

The test device can be part of a magnetic resonance tomography system. The test device can be integrated or located remotely in another room in this case. The test device can also be implemented in a simulated environment of a magnetic resonance tomography system and independent of an actual system.

The invention also comprises a computer program product, which can be loaded directly into a processor and includes program code means for executing all of the steps of the inventive method when the program is executed in the processor.

Further particularly advantageous embodiments and developments of the invention are derived from the dependent claims and the following description. The inventive test device can also be developed in the same way as the dependent method claims in this case.

According to a particularly preferred exemplary embodiment of the method according to the invention, the echo train position of a first k-space element is compared with the echo train position of a second k-space element, which is immediately adjacent to the first k-space element Immediately adjacent in this case means that the phase coding step in a ky direction and/or the phase coding step in a kz direction differs by "1". Adjacent elements therefore indicate immediately consecutive coding steps in one of the two directions or in both directions Immediately adjacent k-space elements which have clear signal differences are most likely to result in artifacts.

In an embodiment which is based on this, provision is made for specifying a permissible maximal difference in the echo train position, and comparing the difference in the echo train position, as determined by the comparison, with the permissible maximal difference. An error message is output if the permissible maximal difference is exceeded.

A possible permissible maximal difference can be "3", for example, indicating that the echo train positions which fill the adjacent k-space elements are allowed to differ by a maximum of "3". The adjacent elements can come from the same echo train or from different echo trains in this case. Echoes from different echo trains can be at the same position, for example. This may be the $40^{th}$ echo in both cases, for example. Alternatively, assuming a permissible maximal difference of "3", it is also possible for two adjacent elements to be occupied by the $40^{th}$ echo and the $43^{rd}$ echo, either from the same echo train or from different echo trains. However, if an algorithm to be tested results in an echo which has the echo train position 40 being situated next to an echo measured value that is obtained from the echo train position 45 (of the same echo train or a different echo train), an error message is output. The algorithm developer can quickly draw conclusions about possible artifacts on the basis of the error messages.

In a preferred embodiment, the method is extended such that the echo train position of a first k-space element is compared with all of the k-space elements immediately adjacent to the first k-space element. In the case of a k-space element lying in a central region of the matrix, this concerns eight adjacent fields. In peripheral regions, only three (corner position) or five (edge position) fields may be concerned.

In a particularly preferred embodiment, this comparison step is performed with essentially all immediately adjacent k-space elements for essentially all k-space elements.

In an embodiment of the method, provision is made for specifying not just one permissible maximal difference, but a first and a second permissible maximal difference. In this case, the first permissible maximal difference applies in the direction of the ky axis, i.e. in the direction of the phase coding steps in a ky direction, and the second maximal difference applies in a kz direction, i.e. in the direction of the phase coding steps in a kz direction. It is then possible to distinguish, with reference to the imaging task, whether a deviation in a first direction is more detrimental than in a second direction.

In a further embodiment, one or both permissible maximal differences are assigned further permissible differences which are smaller than the permissible maximal difference. The actual differences as determined by means of comparison are weighted accordingly. For example, the maximal permissible difference could be set to "9", i.e. an echo interval or a difference between the echo train positions must not exceed a maximum of "9". If the actual difference is between "7" and "9", the difference could be weighted by 2, for example. If the interval is between "4" and "7", a weighting of 1 could be used, while a weighting of 0 could be applied in the case of an interval of "0" to "4". This means that differences closer to the maximal permissible difference are weighted more heavily than smaller differences.

It is then possible to specify a first measure of quality, which must not be exceeded by the totalized weighted differences in the echo train position of adjacent k-space elements. In one case, for example, eight differences are determined for a k-space element which is located in the center of the k-space or in a central area of the k-space. The eight differences are weighted and totalized in each case. The value thus determined must not then exceed the first measure of quality.

In a further embodiment, provision can be made for specifying a second measure of quality, which expresses how often at least one of the permissible maximal differences may be exceeded. This means that outliers can be permitted, i.e. a few or a given number of adjacent k-space elements are allowed to exceed the permissible maximal difference that has been specified. The second measure of quality makes it possible to evaluate whether the number of outliers is already critical to the image quality or whether the outliers can be tolerated.

Both the first measure of quality and the second measure of quality can be differentiated, such that different measures of quality can apply to k-space elements at different locations of the k-space. The central k-space elements generally determine the image contrast. It is therefore conceivable to apply stricter quality criteria to the center of the k-space than to the edge region of the k-space. The test method can therefore be adapted to a considerable extent to the respective imaging task.

In a further embodiment, the k-space elements to be checked are situated in the center of the k-space along an axis of the phase coding steps in a kz direction. The k-space elements in the center of the k-space generally determine the contrast. It is therefore often necessary for all of the elements to be included in the center of the k-space along an axis of the phase coding steps in a kz direction at a specific time, i.e. with reference to a specific echo position. Each of these elements is therefore filled by the $20^{th}$ pulse of a respectively different echo train in each case. This requirement cannot be satisfied, for example, if the k-space is filled with a number of echo trains that is smaller than the number of phase coding steps in the case of flexible reordering. The checking includes a comparison with a predefined echo train reference position. Therefore not relative differences but (also) absolute differences are formed.

In a further embodiment of this embodiment, a smaller deviation from the echo train reference position is permitted for the k-space element in the center of the axis than for k-space elements at the edge of the k-space along the axis. Since a requirement for 0 tolerance, i.e. exact compliance with the predefined echo train reference position, cannot be satisfied at all positions in any case, the strict requirement is intended for the center of the axis while deviations are possible towards the edge. In a particularly preferred embodiment, provision is also made for checking the k-space elements in the center of the k-space along an axis of the phase coding steps in a ky direction. It may apply here likewise that a smaller deviation (or no deviation) from the echo train reference position is permitted in the center of the k-space than at the edge of the k-space.

The invention is explained again in further detail below with reference to the appended figures and exemplary embodiments. In this case, identical components are denoted by identical reference characters in the different figures. The figures are not generally to scale.

BRIEF DESCRIPTION OF THE DRAWINGS

FIG. 3 shows an extract from a k-space, and FIG. 4 shows a schematic and simplified representation of a magnetic resonance tomography system.

DETAILED DESCRIPTION OF INVENTION

Figure 1:
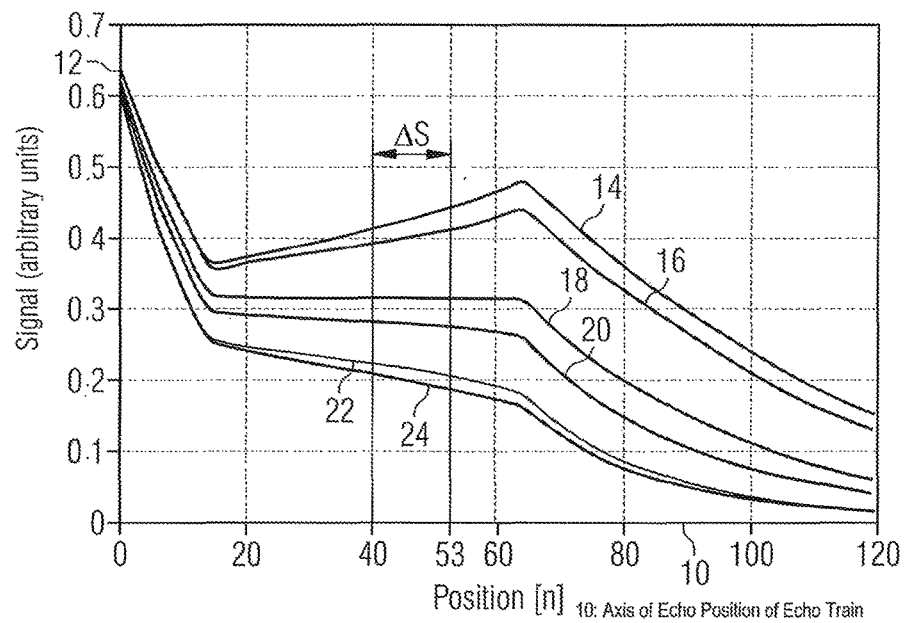
FIG. 1 shows a diagram in which normalized signal intensities in arbitrary units are plotted over individual echoes of an echo pulse sequence for different tissues.

FIG. 1 is already discussed in the introductory part of the specification. Echo positions n of an echo train from a SPACE sequence are plotted along an axis 10. Signal intensities in arbitrary units are plotted along an axis 12. Six curves 14, 16, 18, 20, 22 and 24 show signal profiles for different tissue types as already described in the foregoing. As a result of using a refocusing pulse sequence, which uses pulses having different flip angles throughout the duration of the echo train, the signal intensities change sometimes significantly within a curve during the echo train. The exemplary echo interval ΔS of 13 echo positions between the $40^{th}$ and the $53^{rd}$ position would not exhibit any signal intensity difference in the curve 18, but in the case of the curves 14 and 24 exhibits a signal intensity difference which cannot be ignored and may cause artifacts. The curve profile is clearly steeper in the region of the first echo positions 1 to 15, and larger signal differences already occur in the case of smaller echo position intervals.

Figure 2:
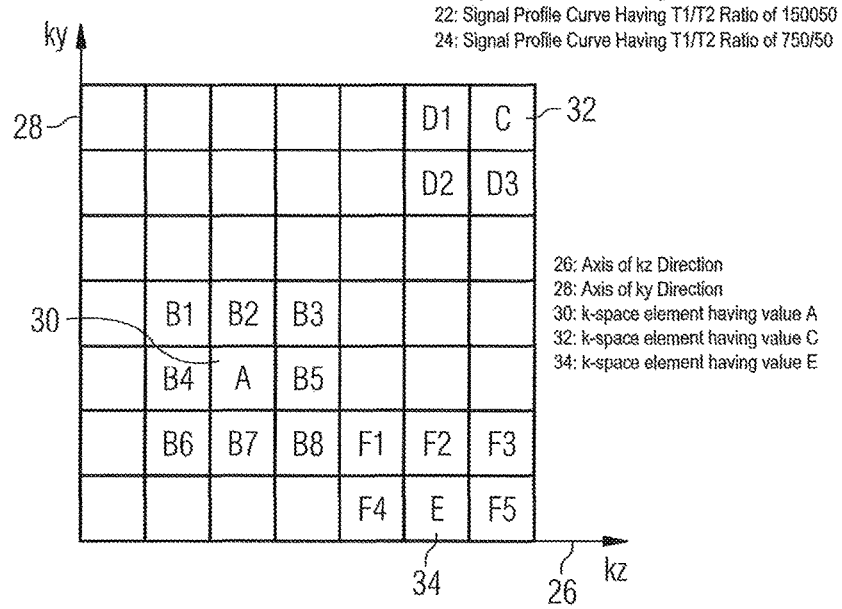
FIG. 2 shows an extract from a k-space.

FIG. 2 shows an extract from a k-space, having an axis 26 along which the phase coding steps are plotted in a kz direction, and an axis 28 which is perpendicular thereto and along which the phase coding steps are plotted in a ky direction. The k-space featuring kz and ky axes, particularly in the context of 3D capture, is known per se and is not described further. The k-space is a matrix into which measurement results are entered according to a predefined methodology. It is important to note that only a very small extract of the k-space is represented in FIG. 2. It is possible and usual for the number of phase coding steps to be in the order of approximately 100 to 1000 in both a ky direction and a kz direction. The number of echoes in an echo train can be in the order of 30 to 200, for example. The number of echoes in an echo train is also referred to as a turbofactor in this case. Assuming a turbofactor of 100 and e.g. 10 echo trains, 1000 different phase coding steps can be included in the two directions ky and kz combined, i.e. 1000 k-space elements. It is noted again that the k-space does not have to be filled on a row-by-row or column-by-column basis, and that different trajectories (i.e. different reordering algorithms) including e.g. spiral or radial forms are also possible.

A k-space element 30 is designated A. The value A was determined e.g. by the $40^{th}$ echo of a $10^{th}$ echo train and indicates the signal intensity. The k-space element 30 is situated within the k-space and is surrounded by eight k-space elements B1, B2, B3, B4, B5, B6, B7 and B8. The eight k-space elements B are immediately adjacent to the k-space element A. Depending on the reordering algorithm, the eight k-space elements B can come from different echo trains or all from the same echo train. If they come from different echo trains, they can all come from the same echo train position, e.g. also from the $40^{th}$ echo like k-space element A. If they all come from the same echo train, they can be generated from consecutive echoes, i.e. from e.g. the $35^{th}$ echo, the $36^{th}$ echo, etc. The signal intensities may differ more or less markedly depending on the reordering algorithm and tissue type. Artifacts can occur in the case of significant signal intensity differences. A signal difference in the k-space can be mathematically described by a superimposed rectangular function. The subsequent Fourier transformation for image generation converts the rectangular function into a sine function, which is superimposed on the image and results in blurring.

In a test method for the reordering algorithm, the echo train positions of adjacent k-space elements are therefore compared with each other in order to ensure that only small signal differences caused by intervals in the echo train position are likely. The test method can be preceded by a simulation run of a pulse sequence, from which it is possible to see which pulse in which pulse train holds which k-space step. In the embodiment described here, the k-space element A is compared with all of the k-space elements B surrounding it. For the purpose of evaluating the deviation, a maximal permissible difference in the echo train position (echo position) can be specified in advance. A deviation of "5" may be allowed, for example. It is assumed that B1, B2 and B3 are generated from a $39^{th}$, $40^{th}$ and $43^{rd}$ echo position, for example. The difference is then "1", "0", and "3" respectively, and is permissible. B4 and B5 are assumed to come from a $49^{th}$ and a $60^{th}$ echo train position, for example. The difference in the echo train position relative to the echo train position 40 of A is then "9" or "20" respectively, and exceeds the specified deviation of "5". A corresponding error message can then be output in the test method and the reordering algorithm can be modified.

It is also possible to specify two maximal permissible differences depending on whether the adjacent k-space element is located in the same row or not. A different value for B4 and B5 would then apply than for B1, B2, B3, B6, B7 or B8. Correspondingly, it is also possible to specify two maximal permissible differences depending on whether the adjacent k-space element is located in the same column or not.

The comparison with the immediately adjacent k-space elements is advantageously performed for all k-space elements. For a k-space element 32 having the value C, which is located in a corner of the k-space, there are only three immediately adjacent k-space elements D1, D2 and D3. For a k-space element 34 having the value E, which is located at the edge of the k-space, there are five immediately adjacent elements F1, F2, F3, F4 and F5.

The proposed specification of a maximal permissible difference may result in very many error messages if the specified maximal permissible difference is very low. If the maximal permissible difference is set too high, however, the information about image quality is adversely affected. Depending on the application scenario, it may therefore be beneficial to define not just one maximal permissible difference but a plurality of thresholds, i.e. such that a permissible maximal difference is assigned further permissible differences which are smaller than said permissible maximal difference. In the example cited above for the k-space element 30, the maximal permissible difference may be "10" while a second permissible difference may be "5" and a third permissible difference may be "2". The differences "0" and "1" as determined by means of comparison are smaller than "2" and can be weighted by "0", i.e. they are ignored. The difference "3" as determined by means of comparison is greater than "2" but smaller than "5" and can be weighted by "1". The difference "9" as determined by means of comparison is greater than "5" but smaller than "10" and can be weighted by "2". The difference "20" as determined by means of comparison is greater than "10" and can be weighted by "3". The weighted differences can then be totalized, the values B1 to B5 giving: 0*0+1*0+3*1+9*2+20*3=78. The differences for B6, B7 and B8 must obviously also be calculated, weighted and added to this. A first measure of quality can be specified for the value of the totalized weighted differences ("78" in this example), wherein said first measure of quality must not be exceeded by the totalized weighted differences.

A further measure of quality is also conceivable, specifying how many outliers (i.e. significant deviations) are permitted. It may be critical to the image quality in an application scenario that no differences greater than "20" are permitted. It is also possible, for example, to permit a number N of differences greater than "20" across all of the k-space elements that are respectively compared with their immediate neighbors, N being any desired natural number in this case. The echo position difference of "20" is selected purely arbitrarily as an example. Other echo train position differences can also be used as the limit for the second measure of quality.

FIG. 3 likewise shows an extract from a k-space, having an axis 26 along which the phase coding steps are plotted in a kz direction, and an axis 28 which is perpendicular thereto and along which the phase coding steps are plotted in a ky direction. K-space elements 36, 38, 40, 42 and 44 are located in a row 46 of the k-space. The row 46 is the central row of the k-space and the k-space elements situated here generally determine the contrast of the image. Signal differences between these elements therefore have a particular significance. A good image contrast is ensured by careful planning and checking of the way in which the k-space elements in the center are filled.

The k-space elements in the central row 46 are generally assigned an echo train reference position. In the case of flexible reordering methods, in which the number of echo trains is smaller than the number of phase coding steps in a kz direction, it is not possible for all of the k-space elements in the row 46 to come from the $5^{th}$ echo train position, for example. Each echo train obviously contains only one $5^{th}$ echo, and only as many k-space elements as there are echo trains can be filled by a value that is generated by a $5^{th}$ echo. A comparison of the echo train positions of the k-space elements in row 46 with the echo train reference position will therefore produce error messages, i.e. deviations. In addition to the possible specification of a general maximal permissible difference as discussed above, a smaller deviation from the echo train reference position can be specified as permissible for the k-space-element in the center of the row 46, i.e. for the k-space element 36, than for the k-space-elements 42 and 44 at the edge of the k-space. For example, a maximal permissible difference of "0" may be set for element 36, while a difference of x % may be permissible for the elements 38 and 40. If the echo train reference position is 20, for example, the specification for element 36 is only satisfied if the element 36 is filled by a $20^{th}$ echo. If x=10, the specification for elements 38 and 40 is still satisfied if the echo train position is between 18 and 22, i.e. deviates by a maximum of 10%. If y=20, the specification for elements 42 and 44 can be satisfied by an echo train position between 16 and 24. Echo train position can also be expressed as echo time, i.e. the time that elapses between the excitation pulse and the corresponding echo. It is obviously also possible to stipulate a smaller or larger number of k-space elements having 0% tolerance in the center of the k-space.

The tolerance extending from the center of the k-space to the edge of the k-space can be graded variously, both as a function of the number of echo trains and as a function of the number of phase coding steps in a kz direction. If the number of echo trains remains the same, an increase in the number of phase coding steps will cause an increase in the tolerance toward the edge of the k-space.

FIG. 3 only illustrates a gradation of the tolerance in a kz direction. However, a corresponding gradation can also be applied to the central column 48, i.e. in a ky direction. In particular, the selected tolerance at the edge may be different in each case if the resolution, i.e. the number of phase coding steps, in a kz direction is different to that in a ky direction.

FIG. 4 shows a magnetic resonance tomography system 50 which features a control device 52 and a conventional scanner 54 comprising a couch 56 on which is positioned the body to be examined. The magnetic resonance tomography system 50 is suitable for emitting a spin echo magnetic resonance pulse sequence, including e.g. a 3D spin echo magnetic resonance pulse sequence. The scanner 54 comprises a magnet for generating a basic magnetic field $B_0$ and antennas for generating a high-frequency magnetic field $B_1$. Magnetic resonance tomography systems are known from the prior art and need not be explained in further detail here. The control device 52 controls the scanner in a customary manner. A test device 58 is connected to the control device. The test device 58 can also be operated independently of the magnetic resonance tomography system 50, it can be an integrated component or located remotely. The test device comprises at least one processor, into which a computer program product can be directly loaded. Program code means of the computer program product allow all of the steps of the inventive test method to be executed. The test device 58 comprises a checking module 59 by means of which the echo train positions of elements of the k-space can be checked.

In conclusion, it is noted again that the test methods described in detail above and the illustrated magnetic resonance tomography system are merely exemplary embodiments which can be modified in all manner of ways by a person skilled in the art without thereby departing from the scope of the invention. Moreover, the use of the indefinite article "a" or "an" does not preclude multiple occurrences of the features concerned. Likewise, the term "unit" does not preclude the relevant components from consisting of a plurality of interacting subcomponents, which can also be spatially distributed if applicable.

The invention claimed is:

1. A method that evaluates k-space data acquired by the operation of a magnetic resonance (MR) apparatus, said method comprising:

operating an MR data acquisition scanner, while a subject is situated therein, in order to execute a spin echo MR data acquisition sequence in which a plurality of individual echoes are acquired from the subject in each of a plurality of echo trains, and in which each echo train is phase-encoded by a phase-encoding gradient, each individual echo having a signal intensity and having a sequence position in the echo train in which that individual echo was acquired;

using a computer to enter said individual echoes into a memory organized as k-space, as k-space data, so that said individual echoes occupy original positions in k-space according to said phase-encoding, thereby producing a signal evolution of said signal intensity of said individual echoes with regard to the respective original positions of said individual echoes in k-space determined by said phase-encoding;

in said computer, executing a reordering algorithm that changes the respective original positions in k-space in to reordered positions respectively occupied by said individual echoes, in order to reduce artifacts in an MR image that is reconstructed from said k-space data, due to said signal intensity impermissibly changing by an amount of change that was calculated in said reordering algorithm over a number of said original positions that were changed in said reordering algorithm, and thereby causing said individual echoes to be situated at said reordered positions in k-space;

in said computer, testing said reordered positions by comparing, for a selected k-space element, a sequence position of the individual echo represented in the selected k-space element to the sequence position of the individual echo represented in a k-space element that is adjacent in k-space, to said selected k-space element, said sequence position of said adjacent k-space element being either a sequence position of the individual echo represented in the adjacent k-space element in a same echo train of, or a different echo train from, the echo train of the individual echo represented in said selected k-space element and, when said selected position of the individual echo represented in said selected k-space element exceeds a predetermined amount of change from the sequence position of the individual echo represented in said adjacent k-space element, generating an error message in said computer;

in said computer, in response to said generated error message, modifying said reordering algorithm and applying the modified reordering algorithm to said original positions of said individual echoes in k-space, and again testing the reordered positions produced by said modified reordering algorithm, and then subsequently repeating said testing and said modifying until said predetermined amount of change is not exceeded; and making the k-space data, that has been organized in k-space according to the reordering algorithm for which said predetermined amount of change is not exceeded, available as a data file from said computer in a form which allows the reconstruction of said MR image therefrom.

2. A method as claimed in claim 1 comprising operating said MR data acquisition scanner in order to apply respective phase-encoding gradients in two different phase-encoding directions and, when testing said reordered positions, calculating whether said predetermined amount of change is exceeded with respect to each of said phase-encoding directions.

3. A method as claimed in claim 2 comprising implementing said testing of the reordering algorithm in said computer with respect to all k-space elements that surround and are adjacent to said selected k-space element in said two different phase-encoding directions.

4. A method as claimed in claim 2 comprising using different predetermined amounts of change respectively in said two different phase-encoding directions when testing said reordering algorithm.

5. A method as claimed in claim 2 comprising implementing said testing of the k-space reordering algorithm by determining, in each of said two different phase-encoding direction, a difference between the sequence position of the individual echo signal represented in the selected k-space element from the sequence position of the individual echo signal represented in the adjacent k-space element, and determining a total difference from a combination of said sequence position differences in each of said two direction, and then subsequently comparing the determined total difference to said predetermined amount of change, and generating said error message when said total difference exceeds said predetermined amount of change.

6. A method as claimed in claim 5 comprising differently weighting the respective differences of the sequence positions, in said two different phase-encoding directions in order to calculate said total difference.

7. A method as claimed in claim 1 comprising setting said predetermined amount of change to be dependent on a position in k-space of said selected k-space element relative to a center of k-space.

8. A method as claimed in claim 7 comprising using a smaller predetermined amount of change when the said selected k-space element is closer to said center of k-space.

9. A magnetic resonance (MR) apparatus comprising:
an MR data acquisition scanner;
a computer configured to operate said MR data acquisition scanner, while a subject is situated therein, in order to execute a spin echo MR data acquisition sequence in which a plurality of individual echoes are acquired from the subject in each of a plurality of echo trains, and in which each echo train is phase-encoded by a phase-encoding gradient, each individual echo having a signal intensity and having a sequence position in the echo train in which that individual echo was acquired;
an electronic memory;
said computer being configured to enter said individual echoes, as k-space data, into said electronic memory which is organized as k-space, so that said individual echoes occupy original positions in k-space according to said phase-encoding, resulting in a signal evolution of said signal intensity of said individual echoes with respect to the respective original positions of said individual echoes in k-space as determined by said phase-encoding;
said computer being configured to execute a reordering algorithm that changes the respective original positions in k-space in to reordered positions respectively occupied by said individual echoes, in order to reduce artifacts in an MR image that is reconstructed from said k-space data, due to said signal intensity impermissibly changing by an amount of change that was calculated in said reordering algorithm over a number of said original positions that were changed in said reordering algorithm, and thereby causing said individual echoes to be situated at said reordered positions in k-space;
said computer being configured to test said reordered positions by comparing for a selected k-space element, a sequence position of the individual echo represented in the selected k-space element to the sequence position of the individual echo represented in a k-space element that is adjacent in k-space to said selected k-space element, said sequence position of said adjacent k-space element being either a sequence position of the individual echo represented in the adjacent k-space element in a same echo train of, or a different echo train from, the echo train of the individual echo represented in said selected k-space element and, when said selected position of the individual echo represented in said selected k-space element exceeds a predetermined amount of change from the sequence position of the individual echo represented in said adjacent k-space element, generating an error message in said computer;
in response to said generated error message, said computer being configured to modify said reordering algorithm and applying the modified reordering algorithm to said original positions of said individual echo signals in k-space, and to again test the reordered positions produced by said modified reordering algorithm, and to then subsequently repeat said testing and said modifying until said predetermined amount of change is not exceeded; and
said computer being configured to make the k-space data, that has been organized in k-space according to the reordering algorithm for which said predetermined amount of change is not exceeded, available as a data file from said computer in a form which allows the reconstruction of said MR image therefrom.

10. A non-transitory, computer-readable data storage medium encoded with programming instructions, said storage medium being loaded into a computer of a magnetic resonance (MR) apparatus that comprises an MR data acquisition scanner, wherein said programming instructions when implemented and user with the MR apparatus cause said computer to:
operate said MR data acquisition scanner, while a subject is situated therein, in order to execute a spin echo MR data acquisition sequence during which a plurality of individual echoes are acquired from the subject in each of a plurality of echo trains, and in which each echo train is phase-encoded by a phase-encoding gradient, with each individual echo having a signal intensity and having a sequence position in the echo train in which that individual echo was acquired;
enter said individual echoes, as k-space data, into a memory which is organized as k-space, so that said individual echoes occupy original positions in k-space according to said phase-encoding, resulting in a signal evolution of said signal intensity of said individual echoes with respect to the respective original positions of said individual echoes in k-space as determined by said phase-encoding;
execute a reordering algorithm that changes the respective original positions in k-space in to reordered positions respectively occupied by said individual echoes, in order to reduce artifacts in an MR image that is reconstructed from said k-space data, due to said signal intensity impermissibly changing by an amount of change that was calculated in said reordering algorithm over a number of said original positions that were changed also calculated in said reordering algorithm, and thereby causing said individual echoes to be situated at said reordered positions in k-space;
test said reordered positions by comparing, for a selected k-space element, a sequence position of the individual echo represented in the selected k-space element to the sequence position of the individual echo represented in a k-space element that is adjacent in k-space to said selected k-space element, said sequence position of said adjacent k-space element being either a sequence position of the individual echo represented in the adjacent k-space element in a same echo train of, or a different echo train from, the echo train of the individual echo represented in said selected k-space element and, when said selected position of the individual echo represented in said selected k-space element exceeds a predetermined amount of change from the sequence position of the individual echo represented in said adjacent k-space element, generating an error message in said computer;
in response to said generated error message, modify said reordering algorithm and apply the modified reordering algorithm to said original positions of said individual echo signals in k-space, and again test the reordered positions produced by said modified reordering algorithm, and then subsequently repeat said testing and said modifying until said predetermined amount of change is not exceeded; and
make the k-space data, that has been organized in k-space according to the reordering algorithm for which said predetermined amount of change is not exceeded, available as a data file from said computer in a which allows the reconstruction of said MR image therefrom.

* * * * *